(12) United States Patent
Parthasarathy et al.

(10) Patent No.: US 10,158,029 B2
(45) Date of Patent: Dec. 18, 2018

(54) APPARATUS AND METHODS FOR ROBUST OVERSTRESS PROTECTION IN COMPOUND SEMICONDUCTOR CIRCUIT APPLICATIONS

(71) Applicant: ANALOG DEVICES, INC., Norwood, MA (US)

(72) Inventors: Srivatsan Parthasarathy, Acton, MA (US); Javier Alejandro Salcedo, North Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 253 days.

(21) Appl. No.: 15/050,876

(22) Filed: Feb. 23, 2016

(65) Prior Publication Data
US 2017/0243862 A1    Aug. 24, 2017

(51) Int. Cl.
*H01L 29/872* (2006.01)
*H01L 29/778* (2006.01)
*H01L 27/02* (2006.01)
*H01L 29/205* (2006.01)
*H01L 27/06* (2006.01)
*H01L 29/812* (2006.01)
*H01L 29/10* (2006.01)

(52) U.S. Cl.
CPC ........ *H01L 29/872* (2013.01); *H01L 27/0285* (2013.01); *H01L 29/205* (2013.01); *H01L 29/7783* (2013.01); *H01L 27/0605* (2013.01); *H01L 27/0629* (2013.01); *H01L 29/1075* (2013.01); *H01L 29/8124* (2013.01)

(58) Field of Classification Search
USPC .......................................... 361/56, 91.1, 111
See application file for complete search history.

(56) References Cited

U.S. PATENT DOCUMENTS

| RE33,584 E | 5/1991 | Mimura |
| 5,686,741 A | 11/1997 | Ohori et al. |

(Continued)

FOREIGN PATENT DOCUMENTS

DE    10 2013 109 831 A    3/2014

OTHER PUBLICATIONS

Office Action dated Oct. 11, 2017 for German Patent Application No. 10 2017 103 632.6.

(Continued)

*Primary Examiner* — Danny Nguyen
(74) *Attorney, Agent, or Firm* — Knobbe, Martens, Olson & Bear, LLP

(57) ABSTRACT

Apparatus and methods for compound semiconductor protection clamps are provided herein. In certain configurations, a compound semiconductor protection clamp includes a resistor-capacitor (RC) trigger network and a metal-semiconductor field effect transistor (MESFET) clamp. The RC trigger network detects when an ESD/EOS event is present between a first node and a second node, and activates the MESFET clamp in response to detecting the ESD/EOS event. When the MESFET clamp is activated, the MESFET clamp provides a low impedance path between the first and second nodes, thereby providing ESD/EOS protection. When deactivated, the MESFET clamp provides high impedance between the first and second nodes, and thus operates with low leakage current and small static power dissipation.

20 Claims, 9 Drawing Sheets

(56) References Cited

U.S. PATENT DOCUMENTS

| | | | |
|---|---|---|---|
| 7,285,828 | B2 | 10/2007 | Salcedo et al. |
| 7,566,914 | B2 | 7/2009 | Salcedo et al. |
| 7,593,204 | B1 | 9/2009 | Iversen et al. |
| 7,601,991 | B2 | 10/2009 | Salcedo et al. |
| 7,881,030 | B1 | 2/2011 | Li et al. |
| 8,044,457 | B2 | 10/2011 | Salcedo et al. |
| 8,222,698 | B2 | 7/2012 | Salcedo et al. |
| 8,320,091 | B2 | 11/2012 | Salcedo et al. |
| 8,368,116 | B2 | 2/2013 | Salcedo et al. |
| 8,416,543 | B2 | 4/2013 | Salcedo |
| 8,422,187 | B2 | 4/2013 | Parthasarathy et al. |
| 8,432,651 | B2 | 4/2013 | Salcedo et al. |
| 8,466,489 | B2 | 6/2013 | Salcedo et al. |
| 8,553,380 | B2 | 10/2013 | Salcedo |
| 8,564,065 | B2 | 10/2013 | Donovan et al. |
| 8,592,860 | B2 | 11/2013 | Salcedo et al. |
| 8,610,251 | B1 | 12/2013 | Salcedo |
| 8,637,899 | B2 | 1/2014 | Salcedo |
| 8,665,571 | B2 | 3/2014 | Salcedo et al. |
| 8,680,620 | B2 | 3/2014 | Salcedo et al. |
| 8,723,227 | B2 | 5/2014 | Parthasarathy et al. |
| 8,796,729 | B2 | 8/2014 | Clarke et al. |
| 8,860,080 | B2 | 10/2014 | Salcedo |
| 8,946,822 | B2 | 2/2015 | Salcedo et al. |
| 8,947,841 | B2 | 2/2015 | Salcedo et al. |
| 8,958,187 | B2 | 2/2015 | Parthasarathy et al. |
| 9,006,781 | B2 | 4/2015 | Salcedo et al. |
| 9,088,256 | B2 | 7/2015 | Cosgrave et al. |
| 9,123,540 | B2 | 9/2015 | Salcedo et al. |
| 9,147,677 | B2 | 9/2015 | Salcedo et al. |
| 9,171,832 | B2 | 10/2015 | Salcedo et al. |
| 9,184,098 | B2 | 11/2015 | Salcedo et al. |
| 9,275,991 | B2 | 3/2016 | Salcedo et al. |
| 9,293,912 | B2 | 3/2016 | Parthasarathy et al. |
| 9,478,608 | B2 | 10/2016 | Salcedo et al. |
| 9,634,482 | B2 | 4/2017 | Parthasarathy et al. |
| 2008/0080108 | A1* | 4/2008 | Lin ............... H01L 27/0285 361/56 |
| 2009/0194793 | A1 | 8/2009 | Briere |
| 2009/0206363 | A1 | 8/2009 | Machida et al. |
| 2010/0149701 | A1* | 6/2010 | Drapkin ........ H01L 27/0285 361/56 |
| 2012/0256233 | A1 | 10/2012 | Cui et al. |
| 2012/0262828 | A1 | 10/2012 | Muthukrishnan et al. |
| 2014/0084331 | A1* | 3/2014 | Parthasarathy ..... H01L 27/0248 257/121 |
| 2014/0327048 | A1 | 11/2014 | Chow et al. |
| 2015/0162745 | A1* | 6/2015 | Ikeda ............... H02H 9/046 361/56 |
| 2015/0325659 | A1* | 11/2015 | Hitora ............... H01L 29/66969 257/43 |
| 2016/0020603 | A1 | 1/2016 | Parthasarathy et al. |
| 2016/0204096 | A1 | 7/2016 | Zhao et al. |
| 2016/0261110 | A1 | 9/2016 | Ivanov et al. |
| 2016/0285255 | A1 | 9/2016 | O'Donnell et al. |
| 2016/0300830 | A1 | 10/2016 | Salcedo et al. |
| 2016/0336740 | A1 | 11/2016 | Parthasarathy et al. |
| 2016/0336744 | A1 | 11/2016 | Parthasarathy et al. |
| 2017/0256534 | A1 | 9/2017 | Parthasarathy et al. |
| 2017/0317070 | A1 | 11/2017 | Salcedo et al. |

OTHER PUBLICATIONS

Chang, M. F., "A Manufacturable GaAs BiFET Technology for High Speed Signal Processing," ISSSE 1995 IEEE, pp. 279-282.

Chang, M. F., "Heterojunction BiFET Technology for High Speed Electronic Systems," WOFE 1997 IEEE, pp. 15-20.

Cui et al., "Snapback and Postsnapback Saturation of Pseudomorphic High-Election Mobility Transistor Subject to Transient Overstress," IEEE Electron Devices Letters, vol. 31, No. 5, May 2010, pp. 425-427.

Cui et al., "Development of a New pHEMT-Based Electrostatic Discharge Protection Structure," IEEE Transactions on Electron Devices, vol. 58, No. 9, Sep. 2011, pp. 2974-2980.

Gupta et al., "InGaP-PlusTM—A major advance in GaAs HBT Technology," ANADIGICS, Inc., CSIC 2006 IEEE, pp. 179-182.

Ho et al., "A GaAs BiFET LSI Technology," GaAs IC Symposium, 1994 IEEE, pp. 47-50.

Kazior, T., "Beyond CMOS: Heterogeneous Integration of III-V Devices, RF MEMS and Other Dissimilar Materials/Devices with Si CMOS to Create Intelligent Microsystems," Phil. Trans. R. Soc. A 372, Jan. 2013, 15 pages.

Lin et al., "The Monolithic Integration of InGaAs pHEMT and InGaP HBT Technology for Single-Chip WiMAX RF Front-End Module", HBT Technology Department, WIN Semiconductors Corp, MWSCAS 2011 IEEE, 4 pages.

Moutanabbir et al., "Heterogeneous Integration of Compound Semiconductors" Annual Review of Materials Research, Apr. 2010, 34 pages.

Peatman et al., "InGaP-PlusTM: Advanced GaAs BiFET Technology and Applications", ANADIGICS, Inc., CS MANTECH Conference, May 2007, pp. 243-246.

Streit et al., "Monolithic HEMT-HBT Integration by Selective MBE", IEEE Transactions on Electron Devices, vol. 42, No. 4, Apr. 1995, pp. 618-623.

Streit et al., "Monolithic HEMT-HBT Integration for Novel Microwave Circuit Applications", TRW Electronic Systems and Technology Division, GaAs IC Symposium, 1994 IEEE, pp. 329-332.

* cited by examiner

US 10,158,029 B2

APPARATUS AND METHODS FOR ROBUST OVERSTRESS PROTECTION IN COMPOUND SEMICONDUCTOR CIRCUIT APPLICATIONS

BACKGROUND

Field

Embodiments of the invention relate to electronic systems, and more particularly, to compound semiconductor protection devices.

Description of the Related Technology

Electronic circuits can be exposed to a transient overstress event, or an electrical signal of a relatively short duration having rapidly changing voltage and high power. Transient overstress events include electrostatic discharge/electrical overstress (ESD/EOS) events, such as those arising from the abrupt release of charge from an object or person to an electronic circuit. Transient overstress events can damage an integrated circuit (IC) due to overvoltage conditions and/or high levels of power dissipation over relatively small areas of the IC. High power dissipation can increase circuit temperature, and can lead to numerous problems, such as junction damage, metal damage, and/or surface charge accumulation.

SUMMARY

In one aspect, a compound semiconductor circuit is provided. The compound semiconductor circuit includes a first node, a second node, and a compound semiconductor protection clamp electrically connected between the first node and the second node. The compound semiconductor protection clamp includes a resistor-capacitor (RC) trigger network configured to detect a presence of a transient overstress event between the first node and the second node, and to generate an activation control signal in response to detecting the transient overstress event. The compound semiconductor protection clamp further includes a metal-semiconductor field effect transistor (MESFET) clamp configured to receive the activation control signal from the RC trigger network and to selectively activate a discharge path between the first node and the second node based on the activation control signal.

In another aspect, a compound semiconductor protection clamp is provided. The compound semiconductor protection clamp includes an RC trigger network configured to detect a presence of a transient overstress event between a first node and a second node, and to generate an activation control signal in response to detecting the transient overstress event. The compound semiconductor protection clamp further includes a high electron mobility transistor (HEMT) clamp including a heterojunction structure, a source region disposed over the heterojunction structure, a drain region disposed over the heterojunction structure, and a gate region disposed over the heterojunction structure and positioned between the source region and the drain region. The gate region receives the activation control signal from the RC trigger network and selectively activates a discharge path between the first node and the second node based on the activation control signal.

In another aspect, a method of protecting a compound semiconductor circuit is provided. The method includes detecting a presence of a transient overstress event between a first node and a second node using an RC trigger network of a compound semiconductor protection clamp, generating an activation control signal in response to detecting the transient overstress event using the RC trigger network, receiving the activation control signal as an input to a metal-semiconductor field effect transistor (MESFET) clamp of the compound semiconductor protection clamp, and selectively activating a discharge path between the first node and the second node based on the activation control signal using the MESFET clamp.

DETAILED DESCRIPTION OF CERTAIN EMBODIMENTS

Figure 1:
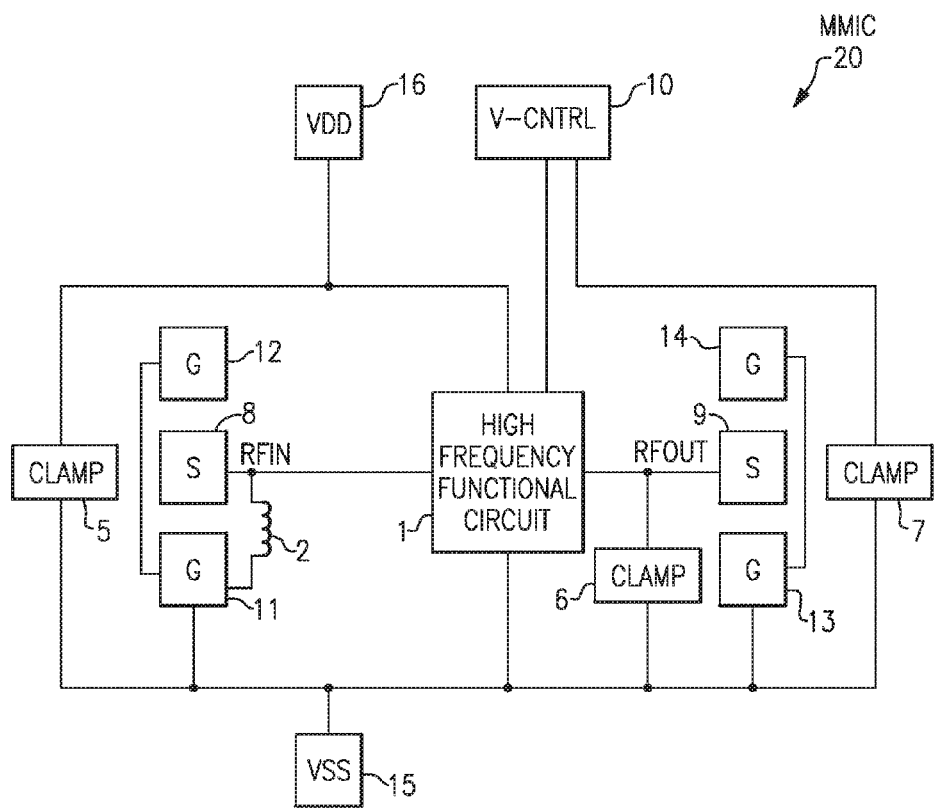
FIG. 1 is a schematic diagram of a monolithic microwave integrated circuit (MMIC) according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

To help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), and/or the International Organization for Standardization (ISO). The standards can cover a wide multitude of transient overstress events, including electrostatic discharge (ESD) events and/or electrical overstress (EOS) events. For instance, a monolithic microwave integrated circuit (MMIC) can be specified to withstand an ESD event in accordance with a human body model (HBM) ESD event of about 200 V or more.

It can be difficult to implement a compound semiconductor circuit, with robust protection from transient overstress events, such as electrical discharge/electrical overstress (ESD/EOS) events. In one example, a process used for fabricating a MMIC may not include a p-type implant. In such implementations, the MMIC cannot be protected from ESD/EOS events using protection circuitry implemented using p-n junctions. In another example, a compound semiconductor protection clamp is used to provide sufficient robustness in applications employing heterogeneous integration of compound semiconductors. For instance, compound semiconductor circuitry can be integrated on a foreign substrate using various processes, such as ion-cut processes that combine semiconductor wafer bonding and undercutting.

Apparatus and methods for compound semiconductor protection clamps are provided herein. In certain configurations, a compound semiconductor protection clamp includes a resistor-capacitor (RC) trigger network and a metal-semiconductor field effect transistor (MESFET) clamp. The RC trigger network detects when an ESD/EOS event is present between a first node and a second node, and activates the MESFET clamp in response to detecting the ESD/EOS event. When the MESFET clamp is activated, the MESFET clamp provides a low impedance path between the first and second nodes, thereby providing ESD/EOS protection. When deactivated, the MESFET clamp provides high impedance between the first and second nodes, and thus operates with low leakage current and small static power dissipation.

The MESFET clamp can be implemented in a variety of ways, including using a high electron mobility transistor (HEMT), such as a gallium arsenide (GaAs) HEMT, indium phosphide (InP) HEMT, or gallium nitride (GaN) HEMT. As skilled artisans will appreciate, a HEMT can also be referred to as a modulation-doped field effect transistor (MODFET) or a heterojunction field effect transistor (HFET). In certain implementations, the MESFET clamp includes one or more pseudomorphic HEMTs.

In one embodiment, the MESFET clamp includes a depletion-mode (D-mode) HEMT having a gate controlled by the RC trigger network. To maintain the D-mode HEMT turned off in the presence of normal operating voltage levels, the D-mode HEMT is electrically connected in series with one or more Schottky gate diodes to bias the D-mode HEMT with a negative gate-to-source voltage when an ESD/EOS event is not present. In certain configurations, each Schottky gate diode is implemented using a gate-to-channel interface of a HEMT. The Schottky gate diodes provide voltage drop that maintains the D-mode HEMT turned off during normal operating conditions. However, when the RC trigger network detects the presence of an ESD/EOS event, the RC trigger network activates the D-mode HEMT to provide a conduction path between the first and second nodes through the D-mode HEMT and the Schottky gate diodes.

In another embodiment, the MESFET clamp is implemented using a multi-gate HEMT controlled by the RC trigger network. In one implementation, the multi-gate HEMT includes a first D-mode gate, a second D-mode gate, and an enhancement-mode (E-mode) gate that is positioned between the first and second D-mode gates and controlled by the RC trigger network. The source of the multi-gate HEMT is electrically connected to the first node and to the first D-mode gate, and the drain of the multi-gate HEMT is electrically connected to the second node and to the second D-mode gate.

In certain configurations, the compound semiconductor protection clamp is further implemented to include a mistrigger protection circuit, which is used to prevent inadvertent activation of the MESFET clamp by the RC trigger network during normal operation. The mistrigger protection circuit can be used generate a filtered voltage based on low pass filtering a voltage difference between the first and second nodes, and to control activation of the MESFET clamp based on the filtered voltage. The feedback provided by the mistrigger protection circuit can prevent certain transient signaling conditions from inadvertently activating the mistrigger protection circuit. Absent a mistrigger protection scheme, a transient signal associated with normal signaling conditions, such as a transient signal associated with IC power-up, may cause the RC trigger network to activate the MESFET clamp.

The teachings herein can be used to provide robust ESD/EOS protection to compound semiconductor chips or dies, such as MMICs and/or circuitry implemented using heterogeneous integration of compound semiconductors. For instance, certain applications can include multi-process technology functional blocks sharing a common substrate, and ESD/EOS protection can be provided by reusing common compound semiconductor protection clamps and/or by compound semiconductor protection clamps that are connected via back-end metallization for protecting neighboring compound semiconductors circuit blocks in separate dies within the common substrate. The compound semiconductor protection clamps can be used to protect electronic circuitry associated with a variety of radio frequency (RF) and/or microwave applications, including, for example, power amplifiers, attenuators, mixers, and/or switches. The compound semiconductor protection clamps provide robust ESD/EOS protection via control of a MESFET clamp using an RC trigger network that actively detects the presence of ESD/EOS events to provide fast activation speed with relatively low voltage overshoot.

Accordingly, a compound semiconductor IC implemented using such protection clamps can meet or exceed specifications related to ESD/EOS robustness in RF and/or microwave circuit applications. The compound semiconductor protection clamp can provide flexibility in scaling to achieve a suitable amount of ESD/EOS protection for different power domains on-chip. The compound semiconductor protection clamp can exhibit superior performance relative to diode-triggered supply clamps, for instance, in applications operating with greater than 5 V power domains.

FIG. 1 is a schematic diagram of a MMIC 20 according to one embodiment. The MMIC 20 includes a high frequency functional circuit 1, an inductor 2, a first compound semiconductor protection clamp 5, a second compound semiconductor protection clamp 6, a third compound semiconductor protection clamp 7, an input signal pin 8, an output signal pin 9, a control voltage pin 10, a first ground pin 11, a second ground pin 12, a third ground pin 13, a fourth ground pin 14, a power low supply pin 15, and a power high supply pin 16.

The illustrated pins can be implemented in a wide variety of ways, including, for example, using pads, ports, leads, and/or other structures.

Although FIG. 1 illustrates one example of a MMIC, the teachings herein are applicable to a wide variety of configurations. For example, the MMIC 20 can be implemented to include additional circuitry, pins, and/or or other structures and/or the MMIC 20 can include components arranged in other ways. Moreover, the MMIC 20 can include more or fewer compound semiconductor protection clamps and/or the compound semiconductor protection clamps can be connected in other configurations.

The high frequency functional circuit 1 can correspond to a wide variety of high frequency circuitry. For example, the high frequency functional circuit 1 can include a power amplifier, a low noise amplifier (LNA), a voltage controlled oscillator (VCO), a mixer, a tuner, a resonator, an attenuator (such as a variable voltage attenuator), and/or a switch.

In the illustrated configuration, the high frequency functional circuit 1 receives a radio frequency (RF) input signal RFIN from the input signal pin 8, a control voltage from the control voltage pin 10, a power low voltage from the power low supply pin 15, and a power high voltage from the power high supply pin 16. Additionally, the high frequency functional circuit 1 generates an RF output signal RFOUT on the output signal pin 9. Accordingly, the illustrated MMIC 20 can be used to process RF signals, such as those used in cellular communications, including, for example, 3G, 4G, LTE, and Advanced LTE and 5G communications.

However, the high frequency functional circuit 1 can also be adapted to operate at frequencies beyond those associated with RF frequencies used for cellular communications. For example, certain communication systems, such as those used in defense and/or commercial applications, can be specified to operate in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz).

As shown in FIG. 1, input and output signaling is provided via a ground-signal-ground (G-S-G) interface. For example, the input signal pin 8 is positioned between the first and second ground pins 11, 12, and the output signal pin 9 is positioned between the third and fourth ground pins 13, 14. Configuring a signaling interface in this manner can aid in providing inductive return paths when operating at high frequencies. Additionally, the G-S-G configuration can also provide signal shielding, thereby enhancing signal integrity.

The illustrated inductor 2 is electrically connected between the input signal pin 8 and the first ground pin 11, and can be used to control a DC bias voltage of the input signal pin 8. However, other configurations are possible, such as implementations in which a DC bias voltage of the input signal pin 8 is controlled externally to the MMIC 20 or using an on-chip DC biasing circuit.

The illustrated ground pins 11-14 and the power low supply pin 15 are electrically connected to one another on the MMIC 20 using metallization. In certain configurations, the power low supply pin 15 is electrically connected to a backside metallization layer by way of a through-substrate via (TSV).

The MMIC 20 can be implemented using a wide variety of compound semiconductor technologies. In certain embodiments, the MMIC 20 is fabricated using a compound III-V semiconductor fabrication process, such as gallium arsenide (GaAs), gallium nitride (GaN), or indium phosphide (InP) manufacturing technology.

The first to third compound semiconductor protection clamps 5-7 have been used to provide ESD/EOS protection to the MMIC 20. For example, the first compound protection semiconductor protection clamp 5 is electrically connected between a first node corresponding to the power low supply pin 15 and a second node corresponding to the power high supply pin 16, and thus serves as a supply clamp. Additionally, the second compound semiconductor protection clamp 6 is electrically connected between a first node corresponding to the power low supply pin 15 and a second node corresponding to the output signal pin 9. Furthermore, the third compound semiconductor protection clamp 7 is electrically connected between a first node corresponding to the power low supply pin 15 and a second node corresponding to the control voltage pin 10. Although one example transient overstress protection scheme is shown, compound semiconductor protection clamps can be connected in a wide variety of ways to provide ESD/EOS protection to a MMIC or other compound semiconductor circuitry.

When an ESD/EOS event is present, one or more of the compound semiconductor protection clamps 5-7 can provide a low impedance path to the power low supply pin 15, thereby diverting charge associated with the ESD/EOS event from sensitive circuitry, such as the high frequency functional circuit 1. In certain implementations, the power low supply pin 15 can be electrically connect to a backside metallization layer using one or more TSVs, and thus can exhibit very low impedance and/or excellent heat dissipation.

It can be difficult to implement the MMIC 20 with robust protection from ESD/EOS events. For example, the MMIC 20 can be fabricated using a compound semiconductor manufacturing process that can constrain implementation of the compound semiconductor protection clamps 5-7. For instance, certain compound III-V semiconductor fabrication processes may not include a p-type implant, and thus p-n junctions may be limited or unavailable.

In certain configurations herein, a compound semiconductor protection clamp, such as one or more of the compound semiconductor protection clamps 5-7 of FIG. 1, is implemented using an RC trigger network and a MESFET clamp. The RC trigger network detects when an ESD/EOS event is present between a first node and a second node, and activates the MESFET clamp in response to detecting the ESD/EOS event. When the MESFET clamp is activated, the MESFET clamp provides a low impedance path between the first and second nodes, thereby providing ESD/EOS protection. When deactivated, the MESFET clamp provides high impedance between the first and second nodes.

Figure 2A:
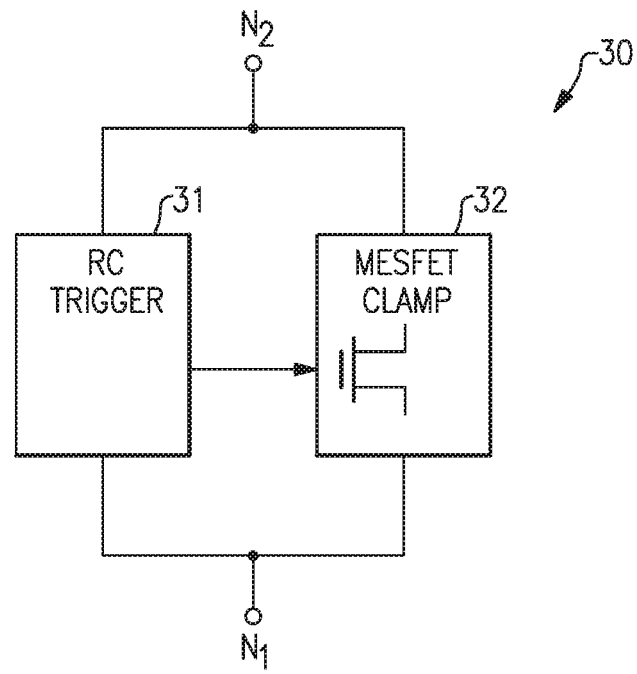
FIG. 2A is a schematic diagram of a compound semiconductor protection clamp according to one embodiment.

FIG. 2A is a schematic diagram of a compound semiconductor protection clamp 30 according to one embodiment. The compound semiconductor protection clamp 30 includes an RC trigger network 31 and a MESFET clamp 32 that are electrically connected in parallel with one another between a first node $N_1$ and a second node $N_2$.

The MESFET clamp 32 receives an activation control signal from the RC trigger network 31. The MESFET clamp 32 uses the activation control signal to selectively activate a discharge path between the first node $N_1$ and the second node $N_2$.

The RC trigger network 31 detects the presence of a transient overstress event, such as an ESD/EOS event, between the first and second nodes $N_1$, $N_2$. When an ESD/EOS event is not detected, the RC trigger network 31 uses the activation control signal to turn off the MESFET clamp 32 such that the MESFET clamp 32 provides high impedance between the first and second nodes $N_1$, $N_2$. However, in response to detecting the presence of the ESD/EOS event, the RC trigger network 31 uses the activation control signal to turn on the MESFET clamp 32 to provide low impedance between the first node $N_1$ and the second node $N_2$.

In certain configurations, the RC trigger network 31 includes a resistor and a capacitor in series between the first node $N_1$ and the second node $N_2$, and the RC trigger network 31 generates the activation control signal based on a rate of voltage change between the first and second nodes $N_1$, $N_2$.

The capacitor and resistor can be sized so as to keep the MESFET clamp 32 turned off in the presence of normal signaling conditions, and to turn on the MESFET clamp 32 when an ESD/EOS event is present. For example, an ESD/EOS event generates a rate of voltage change between the first and second nodes $N_1$, $N_2$ of relatively large magnitude and relatively long duration, and the resistance of the resistor and a capacitance of the capacitor control a corresponding gate voltage of the MESFET clamp when an ESD/EOS event is present.

Additional details of the compound semiconductor protection clamp 30 can be as described earlier.

Figure 2B:
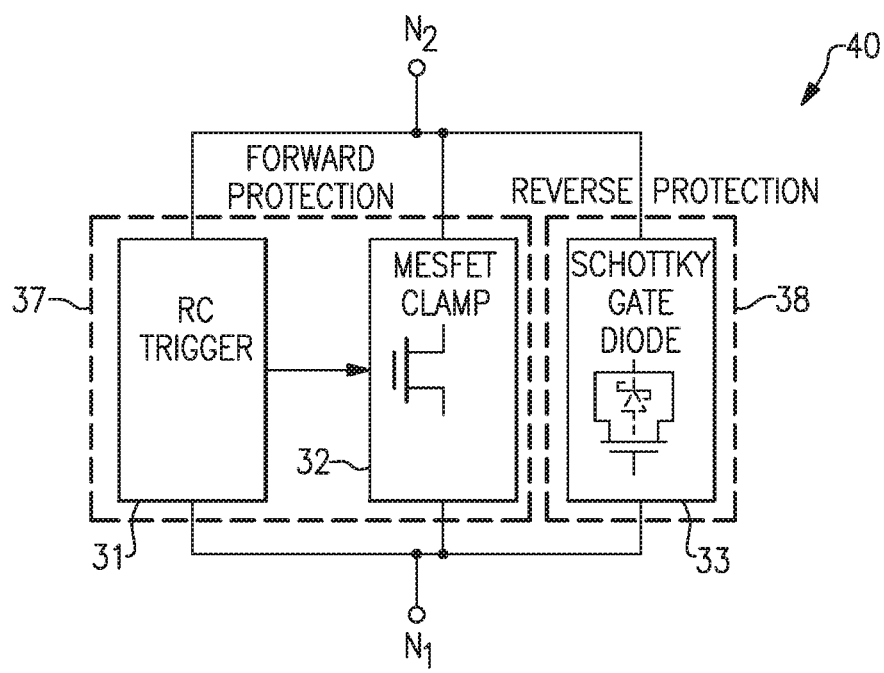
FIG. 2B is a schematic diagram of a compound semiconductor protection clamp according to another embodiment.

FIG. 2B is a schematic diagram of a compound semiconductor protection clamp 40 according to another embodiment. The compound semiconductor protection clamp 40 includes a forward protection circuit 37 and a reverse protection circuit 38 electrically connected in parallel with one another between the first node $N_1$ and the second node $N_2$. The forward protection circuit includes the RC trigger network 31 and the MESFET clamp 32, which can be as described earlier. The reverse protection circuit 38 includes a Schottky gate diode structure 33 including an anode electrically connected to the first node $N_1$ and a cathode electrically connected to the second node $N_2$.

The illustrated compound semiconductor protection clamp 40 provides bidirectional protection against both positive polarity ESD/EOS events that increase the voltage of the second node $N_2$ relative to the first node $N_1$ and negative polarity ESD/EOS events that decrease the voltage of the second node $N_2$ relative to the first node $N_1$. Providing bidirectional protection can enhance the robustness of a MMIC to harsh operating environments.

A MESFET includes a metal gate positioned over a semiconductor channel. In certain configurations, the Schottky gate diode structure 33 is implemented using one or more MESFET gate-to-channel interfaces.

The illustrated compound semiconductor protection clamp 40 provides ESD/EOS protection, and can be implemented without a need to use p-n junctions. Accordingly, the compound semiconductor protection clamp 40 can be used to provide protection to pins of a MMIC that is fabricated using a compound semiconductor fabrication process in which p-n junctions are limited or unavailable.

The first and second nodes $N_1$, $N_2$ can operate within a defined range of voltage during normal circuit operating conditions. For example, in certain implementations, normal circuit operating conditions can be associated with a voltage difference between the second node $N_2$ and the first node $N_1$ between about 3 V and about 7 V. However, other suitable operating voltage conditions will be readily determined by persons having ordinary skill in the art.

In one embodiment, the second node $N_2$ is connected to a signal pad of an IC and the first node $N_1$ is connected to a power low or ground supply. However, other implementations are possible, such as configurations in which the first and second terminals $N_1$, $N_2$ are connected to power low and power high supplies, respectively.

Additional details of the compound semiconductor protection clamp 40 can be as described earlier.

Figure 3:
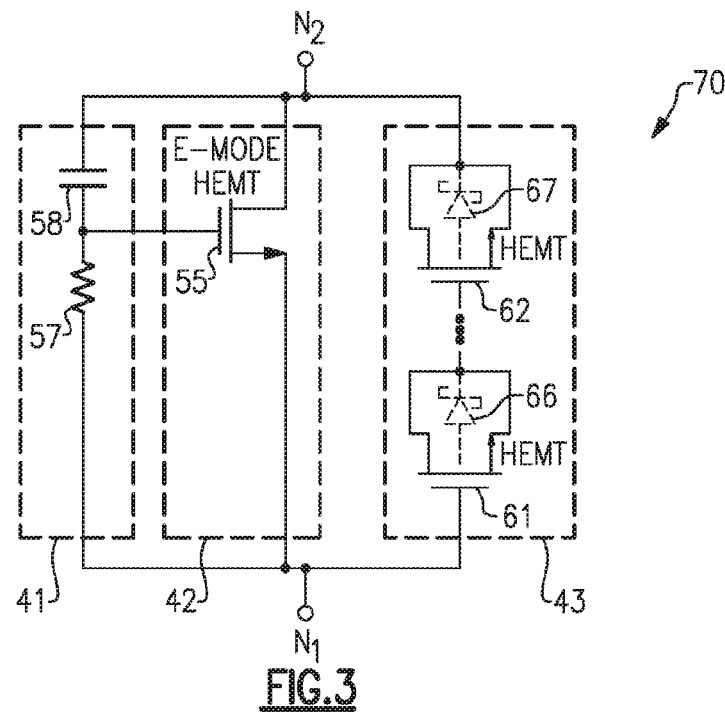
FIG. 3 is a circuit diagram of a compound semiconductor protection clamp according to another embodiment.

FIG. 3 is a circuit diagram of a compound semiconductor protection clamp 50 according to another embodiment. The compound semiconductor protection clamp 50 includes an RC trigger network 41, a MESFET clamp 42, and a Schottky gate diode structure 43, which are electrically connected in parallel with one another between the first node $N_1$ and the second node $N_2$.

The illustrated RC trigger network 41 includes a resistor 57 and a capacitor 58. The resistor 57 includes a first end electrically connected to the first node $N_1$, and a second end electrically connected to a first end of the capacitor 58 at a node that generates an activation control signal for the MESFET clamp 42. The capacitor 58 further includes a second end electrically connected to the second node $N_2$. Although FIG. 3 illustrates one embodiment of an RC trigger network, the teachings herein are applicable to a wide variety of configurations of an RC trigger network, including, for example, implementations in which transistors and/or diodes are used to control triggering.

The resistor 57 and the capacitor 58 can have resistance and capacitance values selected based on a wide variety of considerations, including, for example, characteristics of ESD/EOS events in a particular application and/or a threshold voltage of the MESFET clamp 42. In one embodiment, the resistor 57 and the capacitor 58 have a resistor-capacitor (R*C) time constant is selected to be in the range of 50 ns to 1 us, for instance 500 ns. However, other R*C time constant values are possible.

The MESFET clamp 42 includes an E-mode HEMT 55. The E-mode HEMT 55 includes a gate that receives the activation control signal from the RC trigger network 41, a source that is electrically connected to the first node $N_1$, and a drain that is electrically connected to the second node $N_2$. The illustrated E-mode HEMT 55 has a threshold voltage that is greater than 0 V. Thus, during normal operating conditions, the RC trigger network 41 controls the gate-to-source voltage of the E-mode HEMT 55 to be about equal to 0 V, thereby turning off the E-mode HEMT 55. However, when an ESD/EOS event increases the voltage of the second node $N_2$ relative to the voltage of the first node $N_1$, a displacement current can flow through the capacitor 58 and into resistor 57, thereby generating a voltage drop across the resistor 57 that is sufficient to turn of the E-mode HEMT 55.

The illustrated compound semiconductor protection clamp 70 further includes the Schottky gate diode structure 43, which provides protection against ESD/EOS events that cause the voltage of the second node $N_2$ to decrease relative to the voltage of the first node $N_1$. The illustrated Schottky gate diode structure 43 includes a first HEMT 61 and a second HEMT 62. The first HEMT 61 includes a gate electrically connected to the first node $N_1$, and a source and a drain electrically connected to one another and to a gate of the second HEMT 62. The second HEMT 62 further includes a source and a drain electrically connected to one another and to the second node $N_2$.

A HEMT includes a metal gate and a semiconductor channel, and thus a gate-to-channel interface of a HEMT operates as a Schottky gate diode. FIG. 3 has been annotated to show the first HEMT 61 including a first Schottky gate diode 66, and the second HEMT 62 including a second Schottky gate diode 67. As shown in FIG. 3, the first and second Schottky gate didoes 66, 67 are electrically connected in series with one another from anode-to-cathode between the first and second nodes $N_1$, $N_2$.

Although the Schottky gate diode structure 43 is illustrated as including two HEMTs, the Schottky gate diode structure 43 can include more or fewer HEMTs to achieve a desired reverse protection characteristic. For example, more or fewer HEMTs can be included to provide a reverse trigger voltage desirable for a particular application. The Schottky gate diode structure 43 can be implemented using E-mode transistors, D-mode transistors, or a combination thereof.

Additional details of the compound semiconductor protection clamp 70 can be as described earlier.

Figure 4A:
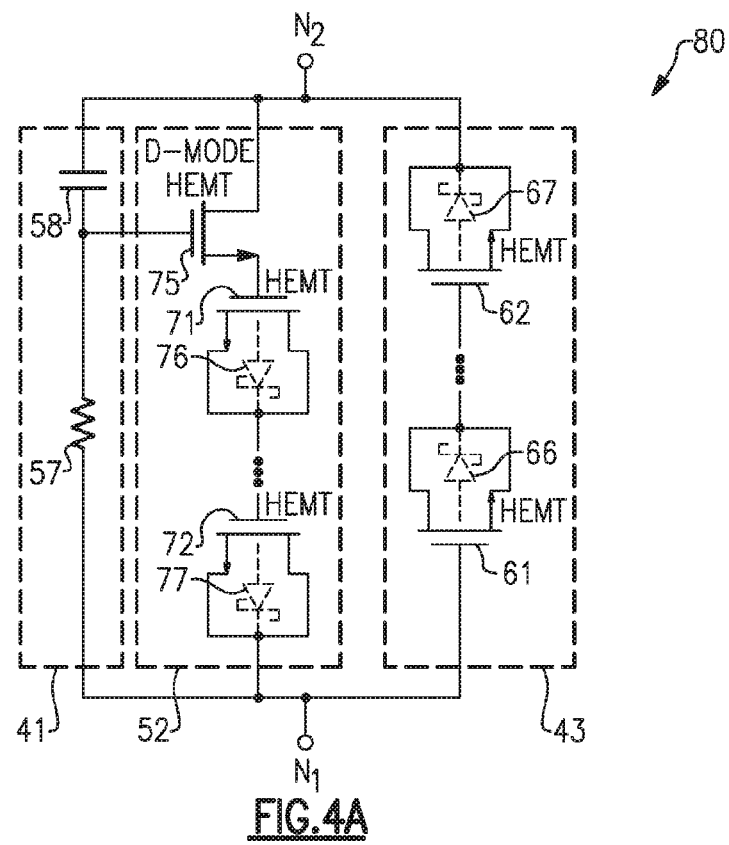
FIG. 4A is a circuit diagram of a compound semiconductor protection clamp according to another embodiment.

FIG. 4A is a circuit diagram of a compound semiconductor protection clamp 80 according to another embodiment. The compound semiconductor protection clamp 80 includes an RC trigger network 41, a MESFET clamp 52, and a Schottky gate diode structure 43, which are electrically connected in parallel with one another between the first node $N_1$ and the second node $N_2$.

The compound semiconductor protection clamp 80 of FIG. 4A is similar to the compound semiconductor protection clamp 70 of FIG. 3, except that the compound semiconductor protection clamp 80 of FIG. 4A includes a different implementation of a MESFET clamp. In particular, the MESFET clamp 52 of FIG. 4A includes a D-mode HEMT 75, a first off-state control HEMT 71, and a second off-state control HEMT 72.

The D-mode HEMT 75 includes a gate that receives an activation control signal from the RC trigger network 41, a drain electrically connected to the second node $N_2$, and a source electrically connected to a gate of the first off-state control HEMT 71. The first off-state control HEMT 71 further includes a source and a drain electrically connected to one another and to a gate of the second off-state control HEMT 72. The second off-state control HEMT 72 further includes a source and a drain electrically connected to one another and to the first node $N_1$.

As shown in FIG. 4A, the first off-state control HEMT 71 has a gate-to-channel interface associated with a first Schottky gate diode 76, and the second off-state control HEMT 72 has a gate-to-channel interface associated with a second Schottky gate diode 77. The first and second Schottky gate diodes 76, 77 are electrically connected in series with one another from anode-to-cathode between the source of the D-mode HEMT 75 and the first node $N_1$.

The illustrated D-mode HEMT 75 is a depletion mode or normally-on transistor having a threshold voltage that is less than or equal to 0 V. Additionally, the first and second off-state control HEMTs 71, 72 maintain the D-mode HEMT 75 turned off during normal operating conditions. In particular, the voltage drop across the first and second Schottky gate diodes generates a negative gate-to-source voltage for the D-mode HEMT 75, thereby maintaining the D-mode HEMT 75 turned off.

Although the illustrated MESFET clamp 52 is illustrated as including two off-state control HEMTs, the MESFET clamp 52 can include more or fewer off-state control HEMTs. For example, a number of off-state control HEMTs can be selected based on a threshold voltage of the D-mode HEMT and/or a Schottky gate diode forward voltage associated with a particular fabrication process. The off-state control HEMTs can be implemented using E-mode transistors, D-mode transistors, or a combination thereof.

Additional details of the compound semiconductor protection clamp 80 can be as described earlier.

Figure 4B:
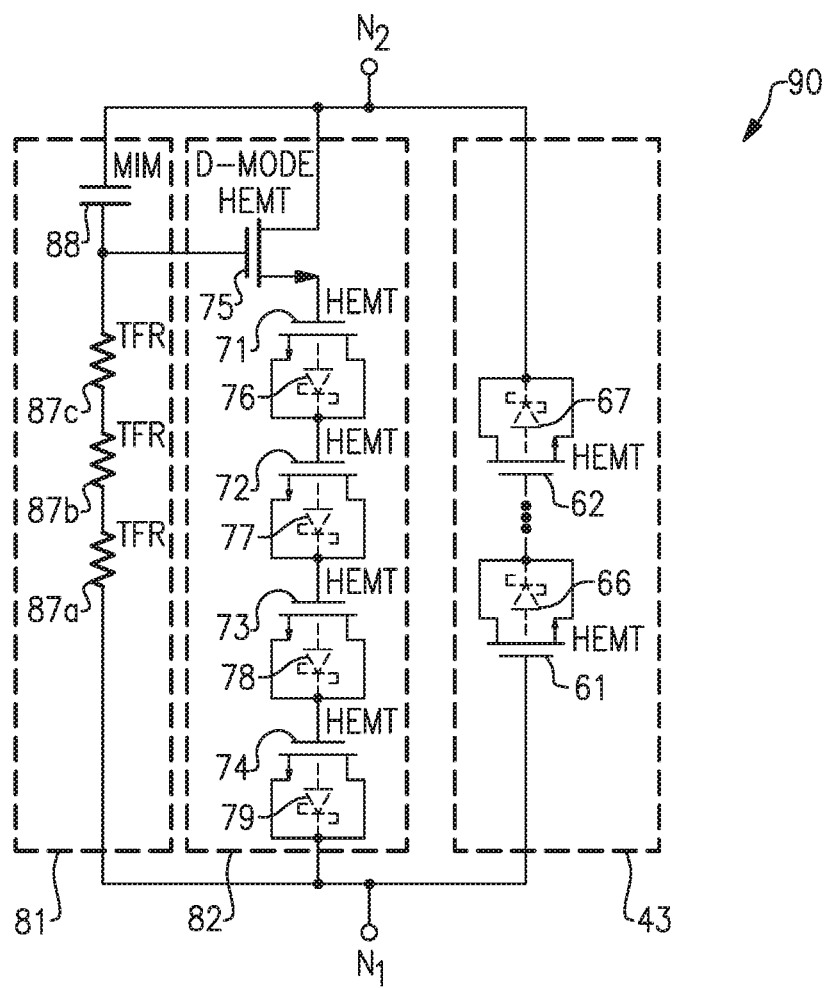
FIG. 4B is a circuit diagram of a compound semiconductor protection clamp according to another embodiment.

FIG. 4B is a circuit diagram of a compound semiconductor protection clamp 90 according to another embodiment. The compound semiconductor protection clamp 90 includes an RC trigger network 81, a MESFET clamp 82, and a Schottky gate diode structure 43, which are electrically connected in parallel with one another between the first node $N_1$ and the second node $N_2$.

The compound semiconductor protection clamp 90 of FIG. 4B is similar to the compound semiconductor protection clamp 80 of FIG. 4A, except that the compound semiconductor protection clamp 90 of FIG. 4B includes a different implementation of a MESFET clamp and a different implementation of an RC trigger network.

As shown in FIG. 4B, the MESFET clamp 82 includes a D-mode HEMT 75, a first off-state control HEMT 71, a second off-state control HEMT 72, a third off-state control HEMT 73, and a fourth off-state control HEMT 74. The first to fourth off-state control HEMTs 71-74 have been annotated to show first to fourth Schottky gate diodes 76-79, respectively, which are associated with gate-to-channel interfaces of the HEMTs. As shown in FIG. 4B, the D-mode HEMT 75 includes a gate that receives an activation control signal from the RC trigger network 81, a drain electrically connected to the second node $N_2$, and a source electrically connected to the first node $N_1$ via the series combination of the first to fourth Schottky gate diodes 76-79.

The illustrated RC trigger network 81 includes a first thin film resistor (TFR) 87a, a second TFR 87b, a third TFR 87c, and a metal-insulator-metal (MIM) capacitor 88 that are electrically connected in series between the first node $N_1$ and the second node $N_2$. Although the illustrated RC trigger network 81 is illustrated as being implemented using MIM capacitor and TFR structures, other configurations are possible. For example, in another embodiment, an RC trigger network includes a mesa resistor and/or a combination of a TFR and a mesa resistor.

Additional details of the compound semiconductor protection clamp 90 can be as described earlier.

Figure 5A:
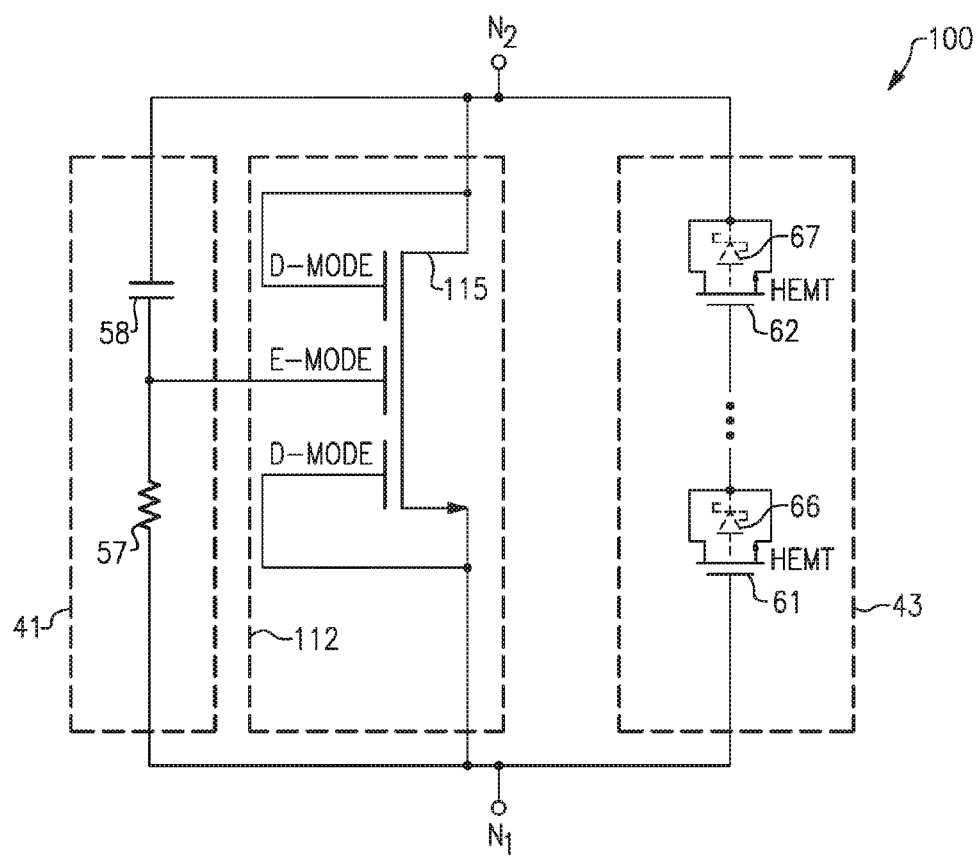
FIG. 5A is a circuit diagram of a compound semiconductor protection clamp according to another embodiment.

FIG. 5A is a circuit diagram of a compound semiconductor protection clamp 100 according to another embodiment. The compound semiconductor protection clamp 100 includes an RC trigger network 41, a MESFET clamp 112, and a Schottky gate diode structure 43, which are electrically connected in parallel with one another between the first node $N_1$ and the second node $N_2$.

The compound semiconductor protection clamp 100 of FIG. 5 is similar to the compound semiconductor protection clamp 70 of FIG. 3, except that the compound semiconductor protection clamp 100 of FIG. 5A includes a different implementation of a MESFET clamp.

In particular, the MESFET clamp 112 of FIG. 5A is implemented using a multi-gate HEMT 115 including a first D-mode gate, a second D-mode gate, and an E-mode gate that is positioned between the first and second D-mode gates. The first and second D-mode gates are depletion mode or normally-on gates having a threshold voltage that is less than or equal to about 0 V. In contrast, the E-mode gate is an enhancement mode or normally-off gate having a threshold voltage greater than about 0 V. In one embodiment, the first and second D-mode gates have a threshold voltage in the range of about −1.0 V to about −2.0 V, and the E-mode gate has a threshold voltage in the range of about 0.3 V to about 0.5 V.

As shown in FIG. 5A, the first D-mode gate is electrically connected to the source of the multi-gate HEMT 115 and to the first node $N_1$. Additionally, the second D-mode gate is electrically connected to the drain of the multi-gate HEMT 115 and to the second node $N_2$. Furthermore, the E-mode gate receives an activation control signal from the RC trigger network 41.

During normal operating voltage conditions between the first and second nodes $N_1$, $N_2$, the RC trigger network 41 biases the MESFET clamp 112 in an off or high impedance state in which the flow of current between the first and second nodes $N_1$, $N_2$ is blocked. For example, the RC trigger network 41 can control the voltage of the E-mode gate to be about equal to the voltage of the first node $N_1$. Thus, the compound semiconductor protection clamp 100 operates in a low leakage/high impedance state for normal operating voltage conditions.

However, during an ESD/EOS event, the compound semiconductor protection clamp 100 provides a low impedance path between the first and second nodes $N_1$, $N_2$ to provide ESD/EOS protection. For example, in response to an ESD/EOS event that increases the voltage of the first node $N_1$ relative to the voltage of the second node $N_2$, the Schottky gate diode structure 43 can activate to provide a discharge path between the first and second nodes $N_1$, $N_2$. Additionally, in response to an ESD/EOS event that increases the voltage of the second node $N_2$ relative to the voltage of the first node $N_1$, the RC trigger network 41 can control the D-mode gate to turn on the multi-gate HEMT 115 and provide a low impedance path between the first and second nodes $N_1$, $N_2$. Thus, a discharge path through the multi-gate HEMT 115 is selectively activated based on the activation control signal from the RC trigger network 41.

When the multi-gate HEMT 115 is turned-on, a low impedance forward conduction path is provided between the first and second node $N_1$, $N_2$ through a channel of the multi-gate HEMT 115. Additionally, at a sufficiently high voltage, a Schottky gate diode associated with the second D-mode gate can become forward-biased and provide an additional path for current flow between the first and second nodes $N_1$, $N_2$.

Although the multi-gate HEMT 115 is illustrated as including three gates, the multi-gate HEMT 115 can be modified to include more or fewer gates and/or a different arrangement of gates.

Figure 5B:
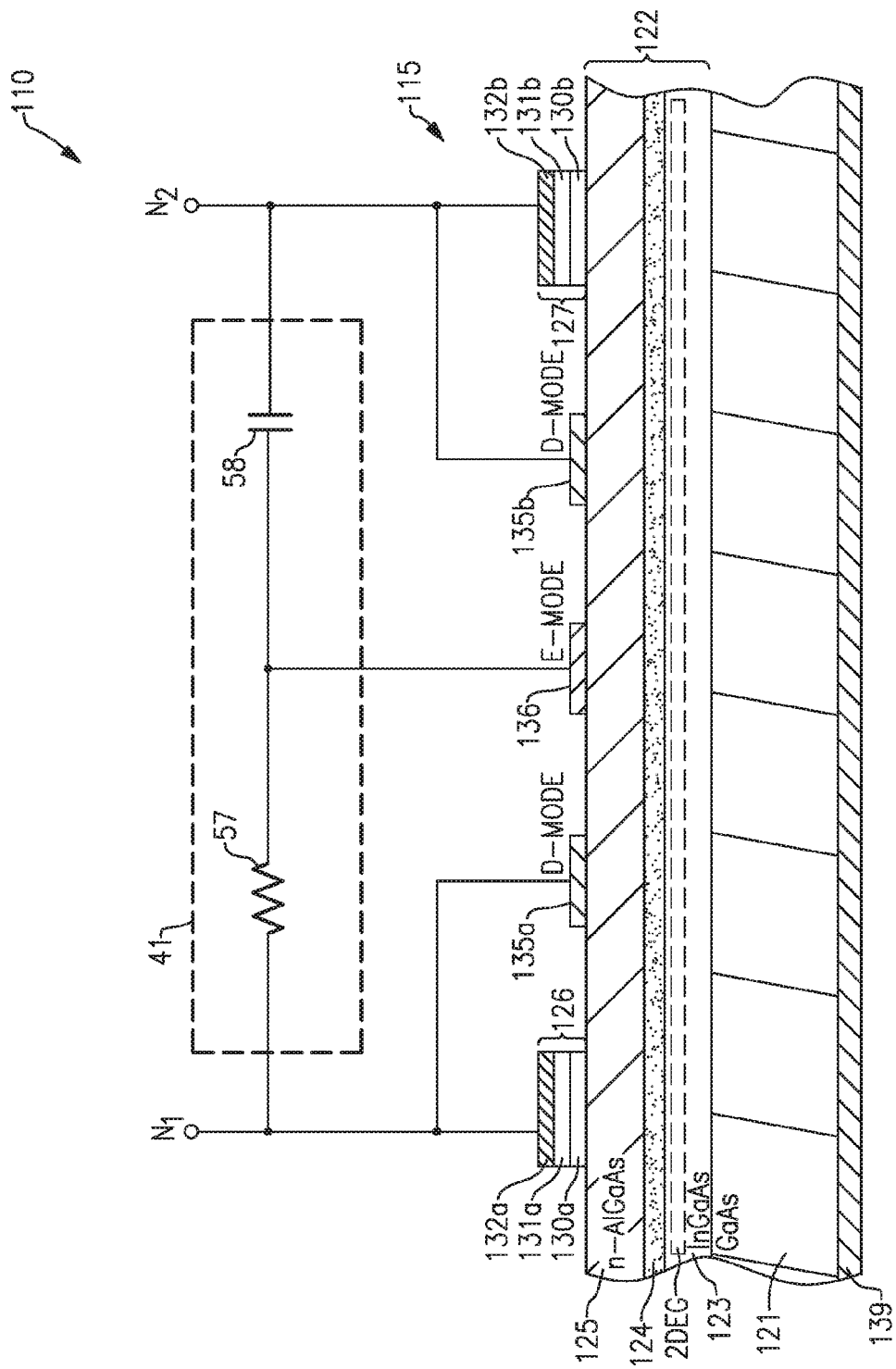
FIG. 5B is an annotated cross-section of a multi-gate high electron mobility transistor (HEMT) according to one embodiment.

FIG. 5B is an annotated cross-section 110 of the multi-gate HEMT 115 of FIG. 5A according to one embodiment. The annotated cross-section 110 includes the RC trigger network 41, the first node $N_1$, and the second node $N_2$, which can be as described above. The multi-gate HEMT 115 is implemented on a gallium arsenide (GaAs) substrate 121, and includes a heterojunction structure 122, a source region 126, a drain region 127, a first D-mode gate region 135a, a second D-mode gate region 135b, and an E-mode gate region 136. As shown in FIG. 5B, the GaAs substrate 121 includes a backside conductor 139.

The heterojunction structure 122 includes an indium gallium arsenide (InGaAs) layer 123 disposed over the GaAs substrate 121, a spacer layer 124 disposed over the InGaAs layer 123, and an n-type aluminum gallium arsenide (n-AlGaAs) layer 125 disposed over the spacer layer 124. The source region 126 is disposed over the heterojunction structure 122 and includes a first n-type GaAs region 130a, a first highly doped n-type GaAs region 131a disposed over the first n-type GaAs region 130a, and a first contact region 132a disposed over the first highly doped n-type GaAs region 131a. Additionally, the drain region 127 is disposed over the heterojunction structure 122, and includes a second n-type GaAs region 130b, a second highly doped n-type GaAs region 131b disposed over the second n-type GaAs region 130b, and a second contact region 132b disposed over the second highly doped n-type GaAs region 131b. In the illustrated configuration, the first and second highly doped n-type GaAs regions 131a, 131b have a higher doping concentration that the first and second doped n-type GaAs regions 130a, 130b.

The E-mode gate region 136 is disposed over the heterojunction structure 122 between the source region 126 and the drain region 127. Additionally, the first D-mode gate region 135a is disposed over the heterojunction structure 122 between the E-mode gate region 136 and the source region 126. Furthermore, the second D-mode gate region 135b is disposed over the heterojunction structure 122 between the E-mode gate region 136 and the drain region 127. In the illustrated embodiment, the first and second D-mode gate regions 135a, 135b and the E-mode gate region 136 include metal. In one example, the first and second D-mode gate regions 135a, 135b and the E-mode gate region 136 include at least one of nickel (Ni), gold (Au), titanium (Ti), or platinum (Pt). As skilled artisans will appreciate, a metal-semiconductor junction associated with a gate of a HEMT operates as a Schottky gate diode.

The GaAs substrate 121 can be an intrinsic substrate having a relatively low doping concentration. In certain implementations, the GaAs substrate 121 can have a relatively thin substrate thickness, such as a thickness in range of about 0.5 μm to about 1 μm. Configuring the GaAs substrate 121 to be relatively thin aids in forming through-wafer vias (TWVs) used to connect circuitry fabricated on the GaAs substrate 121 to the backside conductor 139. Although particular doping concentrations and thicknesses have been described, persons of ordinary skill in the art will readily determine other suitable values.

The heterojunction structure 122, the source region 126, the drain region 127, the first D-mode gate region 135a, the second D-mode gate region 135b, and the E-mode gate region 136 operate as a multi-gate HEMT. For example, as skilled artisans will appreciate, diffusion of electrons from the n-AlGaAs layer 125 into the InGaAs layer 123 can result in the formation of a two-dimensional electron gas (2DEG) region or channel within the InGaAs layer 123. The conductivity of the 2DEG region can be altered or changed by controlling the gate voltages of the first D-mode gate region 135a, the second D-mode gate region 135b, and the E-mode gate region 136.

In one embodiment, the n-AlGaAs layer 125 has a thickness in the range of about 300 nm to about 500 nm, and a doping concentration in the range of about $1\times10^{18}$ atoms/cm$^3$ about $9\times10^{18}$ atoms/cm$^3$. The InGaAs layer 123 can be configured to have a relatively low doping concentration so as to enhance the mobility of electrons by reducing collisions between electrons and doping impurities. For example, in one embodiment the InGaAs layer 123 has a thickness in the range of about 5 nm to about 15 nm, and a doping concentration of less than about $1\times10^{18}$ atoms/cm$^3$. The spacer layer 124 can aid in reducing interface traps or defects between the interface of the InGaAs layer 123 and n-AlGaAs layer 125 associated with different lattice constants of the layers. In one embodiment, the spacer layer 124 includes a layer of AlGaAs having a thickness in the range of about 3 nm to about 6 nm. In certain implementations, one or more layers of the heterojunction structure 122 can be formed using an epitaxial growth process. Although particular doping concentrations and thicknesses have been described, persons of ordinary skill in the art will readily determine other suitable values.

The backside conductor 139 is disposed adjacent the GaAs substrate 121 on a side of the GaAs substrate 121 opposite the heterojunction structure 122. The backside conductor 139 can be electrically biased using a power low or ground supply, and TWVs formed in the GaAs substrate 121 can be used to provide electrical connections between circuitry and the ground supply. For example, in one embodiment the second terminal $N_1$ is electrically connected to the backside conductor 139 using one or more TWVs. In certain implementations, the backside conductor 139 includes at least one of gold (Au) or copper (Cu). Although the backside conductor 139 is illustrated as a single layer, the backside conductor 139 can include multiple sublayers, including, for example, seed and/or barrier sublayers.

The source region 126 and the first D-mode gate region 135a are electrically connected to the first terminal $N_1$. Additionally, the drain region 127 and the second D-mode gate region 135b are electrically connected to the second terminal $N_2$. The multi-gate HEMT 115 can undergo back end processing to form contacts and metallization. For clarity, these details are omitted in favor of using annotated electrical connections.

As shown in FIG. 5B, the RC trigger network 41 is electrically connected between the first and second nodes $N_1$, $N_2$. Although the RC trigger network 41 is depicted in annotated form, the RC trigger network 41 can be implemented on the GaAs substrate 121.

Although FIG. 5B illustrates one implementation of a multi-gate HEMT, other configurations can be used. Additionally, although the protection device has been illustrated in the context of a GaAs process, the teachings herein are applicable to other compound semiconductor technologies, including, for example, gallium nitride (GaN) and indium phosphide (InP) technologies.

Figure 6:
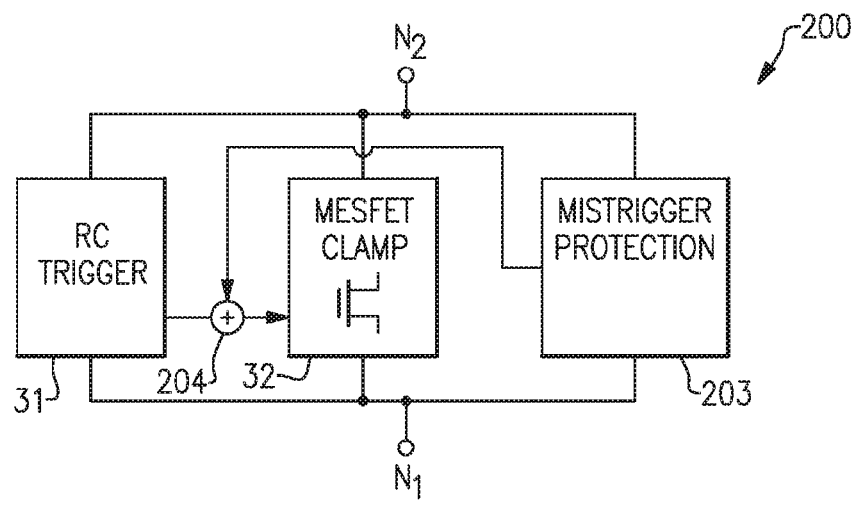
FIG. 6 is a schematic diagram of a compound semiconductor protection clamp according to another embodiment.

FIG. 6 is a schematic diagram of a compound semiconductor protection clamp 200 according to another embodiment. The compound semiconductor protection clamp 200 includes an RC trigger network 31, a MESFET clamp 32, and a mistrigger protection circuit 203, which are electrically connected in parallel with one another between the first node $N_1$ and the second node $N_2$. Although not shown in FIG. 6, the compound semiconductor protection clamp 200 can also include a reverse protection circuit, such as the Schottky gate diode structure 33 of FIG. 2B.

The compound semiconductor protection clamp 200 of FIG. 6 is similar to the compound semiconductor protection clamp 30 of FIG. 2A, except that the compound semiconductor protection clamp 200 further includes a mistrigger protection circuit 203. The mistrigger protection circuit 203 generates a mistrigger protection signal, which is added to the activation control signal from the RC trigger network 31 at a combining node 204. The MESFET clamp 32 selectively activates a discharge path between the first node $N_1$ and the second node $N_2$ based on both the activation control signal and the mistrigger protection signal.

In certain implementations, the mistrigger protection circuit 203 can pull down a voltage of the combining node 204 when an ESD/EOS event is not present, thereby preventing the RC trigger network 31 from inadvertently activating the MESFET clamp 32 when an ESD/EOS event is not present.

For example, absent a mistrigger protection scheme, a transient signal associated with normal signaling conditions, such as a transient signal associated with MMIC power-up, may couple to a gate of the MESFET clamp via the RC trigger network 31.

Thus, the mistrigger protection circuit 203 helps prevent unintended activation of the MESFET clamp 32 in the presence of normal transient activity on the first and second nodes $N_1$, $N_2$. However, during an ESD/EOS event when the activation control signal from the RC trigger network 31 becomes relatively large, the MESFET clamp 32 can selectively activate a discharge path between the first and second nodes $N_1$, $N_2$.

Additional details of the compound semiconductor protection clamp 200 can be as described earlier.

Figure 7:
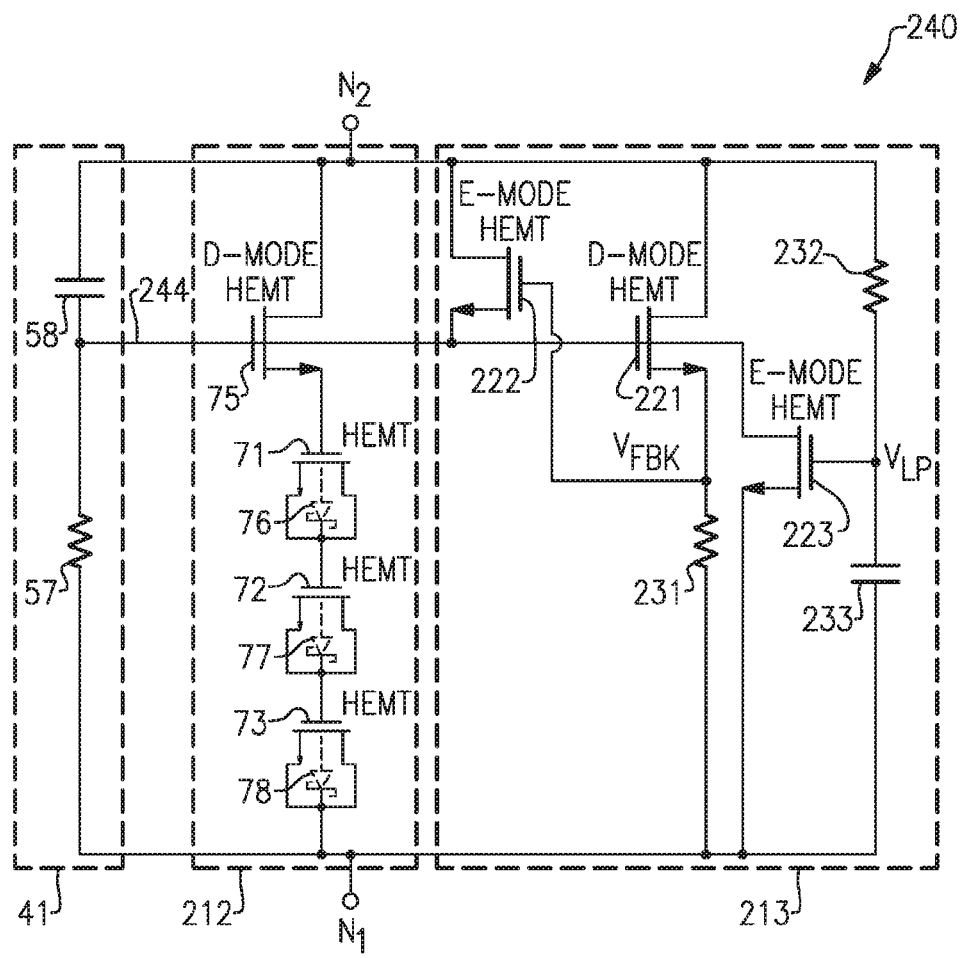
FIG. 7 is a circuit diagram of a compound semiconductor protection clamp according to another embodiment.

FIG. 7 is a circuit diagram of a compound semiconductor protection clamp 240 according to another embodiment. The compound semiconductor protection clamp 240 includes an RC trigger network 41, a MESFET clamp 212, and a mistrigger protection circuit 213, which are electrically connected in parallel with one another between the first node $N_1$ and the second node $N_2$. Although not shown in FIG. 7, the compound semiconductor protection clamp 240 can also include a reverse protection circuit, such as the Schottky gate diode structure 33 of FIG. 2B.

The RC trigger network 41 includes the resistor 57 and the capacitor 58, which provide an activation control signal to a combining node 244. The MESFET clamp 212 includes the D-mode HEMT 75, the first off-state control HEMT 71, the second off-state control HEMT 72, and the third off-state control HEMT 73. As shown in FIG. 7, the gate of the D-mode HEMT 75 is electrically connected to the combining node 244. Additional details of the RC trigger network 41 and the MESFET clamp 212 can be similar to those described earlier.

The illustrated mistrigger protection circuit 213 includes a feedback D-mode HEMT 221, a feedback E-mode HEMT 222, a feedback resistor 231, a mistrigger protection E-mode HEMT 223, a mistrigger protection resistor 232, and a mistrigger protection capacitor 233.

As shown in FIG. 7, the feedback D-mode HEMT 221 includes a drain electrically connected to the second node $N_2$, a gate electrically connected to the combining node 244, and a source electrically connected to a first end of the feedback resistor 231 at a node that generates a feedback voltage $V_{FBK}$. The feedback resistor 231 further includes a second end electrically connected to the first node $N_1$. The feedback E-mode HEMT 222 includes a gate that receives the feedback voltage $V_{FBK}$, a drain electrically connected to the second node $N_2$, and a source electrically connected to the combining node 244. The mistrigger protection capacitor 233 includes a first end electrically connected to the first node $N_1$ and a second end electrically connected to a first end of the mistrigger protection resistor 232 at a node that generates a low pass filtered voltage $V_{LP}$. The mistrigger protection resistor 232 further includes a second end electrically connected to the second node $N_2$. The mistrigger protection E-mode HEMT 223 includes a gate that receives the low pass filtered voltage $V_{LP}$, a source electrically connected to the first node $N_1$ and a drain electrically connected to the combining node 244.

The mistrigger protection resistor 232 and the mistrigger protection capacitor 233 operate as a low pass filter that generates the low pass filtered voltage $V_{LP}$ by low pass filtering a voltage difference between the second node $N_2$ and the first node $N_1$. As shown in FIG. 7, the low pass filtered voltage $V_{LP}$ is provided to the gate of the mistrigger protection E-mode HEMT 223. Configuring the mistrigger protection circuit 213 in this manner causes the mistrigger protection circuit 213 to pull down the combining node 244 and turn off the MESFET clamp 212 when a steady-state voltage condition is reached between the first and second nodes $N_1$, $N_2$. However, when an ESD/EOS event is present between the first and second nodes $N_1$, $N_2$, the RC trigger network 414 can pull up a voltage of the combining node 75 and activate the MESFET clamp 212.

In one embodiment, the mistrigger protection resistor 232 and the mistrigger protection capacitor 233 are combined to achieve an R*C time constant in the range of about 1 us to about 100 us, for instance 50 us. However, other R*C time constant values are possible.

The feedback D-mode HEMT 221 and the feedback resistor 231 operate to generate the feedback voltage $V_{FBK}$, which aids in maintaining the MESFET clamp 212 turned on for a full duration of an ESD/EOS event. For example, a gate of the feedback D-mode HEMT 221 is electrically connected to a gate of the D-mode HEMT 75 to provide a current mirror, and thus a current flowing through the feedback D-mode HEMT 221 changes in relation to a current a flowing through the D-mode HEMT 75 of the MESFET clamp 212. The current through the feedback D-mode HEMT 221 is provided to the feedback resistor 231 to generate the feedback voltage $V_{FBK}$, which controls activation of the feedback E-mode HEMT 222. Thus, while the MESFET clamp 212 is turned on, the feedback E-mode HEMT is turned on by the feedback voltage $V_{FBK}$, thereby providing feedback that pulls up the combining node 244. After the ESD/EOS event has ended, the current flowing through the D-mode HEMT 75 of the MESFET clamp 212 decreases, resulting in a corresponding decrease in the feedback voltage $V_{FBK}$ and the feedback E-mode HEMT 222 turning off.

Accordingly, the illustrated mistrigger protection circuit 213 provides robust control over the activation of the MESFET clamp 212, both preventing unintended activation of the MESFET clamp 212 and ensuring that after the RC trigger network 41 activates the MESFET clamp 212 the MESFET clamp 212 remains turned on for a full duration of the ESD/EOS event.

Additional details of the compound semiconductor protection clamp 240 can be as described earlier.

Figure 8:
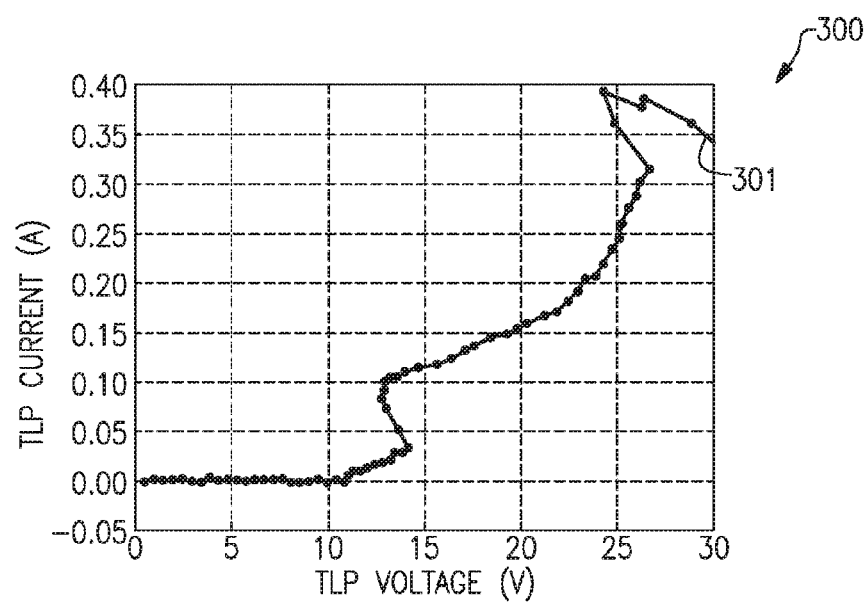
FIG. 8 is a graph of transmission line pulse (TLP) current versus TLP voltage for one implementation of the compound semiconductor protection clamp of FIG. 4B.

FIG. 8 is a graph 300 of transmission line pulse (TLP) current versus TLP voltage for one implementation of the compound semiconductor protection clamp 90 of FIG. 4B. Voltage is expressed along a horizontal axis, and current is expressed along a vertical axis. The TLP applies a pulse having about a 600 ps rise time and about a 100 ns pulse width. The current and voltage reading is captured in 'quasi-static' conditions, as the average voltage and current reading between about 20 ns and 80 ns, corresponding to each data point in FIG. 8.

The graph 300 includes a current versus voltage response 301 for one implementation of the compound semiconductor protection clamp 90 of FIG. 4B for >200 V level of protection, according to HBM (Human Body Model) classification standard. The illustrated current versus voltage response 301 shows a trigger voltage of about 14.5 V and a holding voltage of about 12.5 V. Although one example of TLP data is shown in FIG. 8, TLP data can vary with a wide variety of factors, including, circuit implementation and/or fabrication process.

Figure 9:
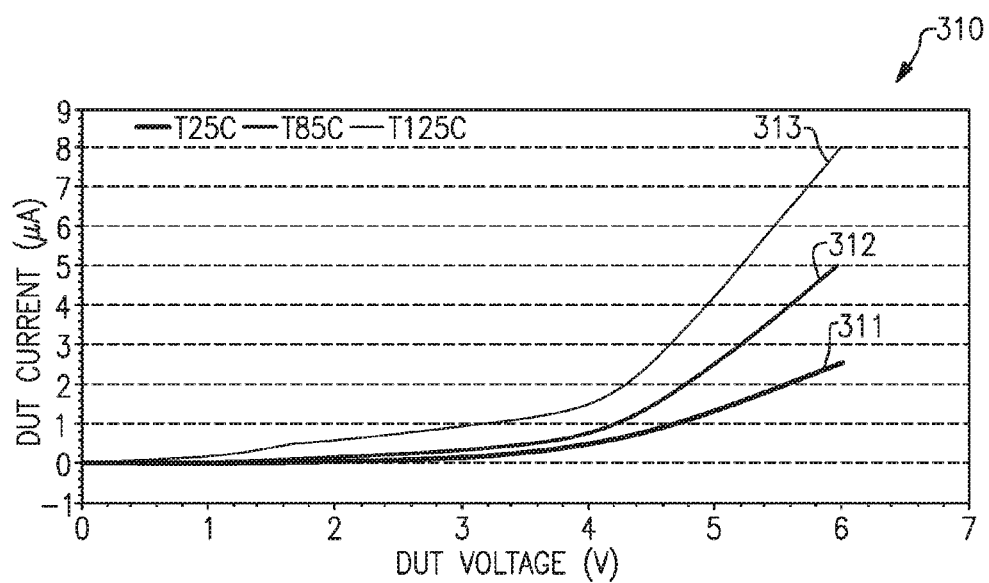
FIG. 9 is a graph of leakage current versus voltage for one implementation of the compound semiconductor protection clamp of FIG. 4B.

FIG. 9 is a graph 310 of leakage current versus voltage for one implementation of the compound semiconductor protection clamp 90 of FIG. 4B, as described above with respect to FIG. 8. Voltage is expressed along a horizontal axis, and current is expressed along a vertical axis.

The graph 310 includes a first current versus voltage response 311 at 25° C., a second current versus voltage response 311 at 85° C., and a third current versus voltage response 311 at 125° C. As shown in FIG. 9, the compound semiconductor protection clamp exhibits a leakage current of less than about 6 μA at an operating voltage of about 5V at up to about 125° C. Although one example of leakage current versus voltage data is shown in FIG. 9, leakage current versus voltage data can vary with a wide variety of factors, including circuit implementation and/or fabrication process.

Figure 10:
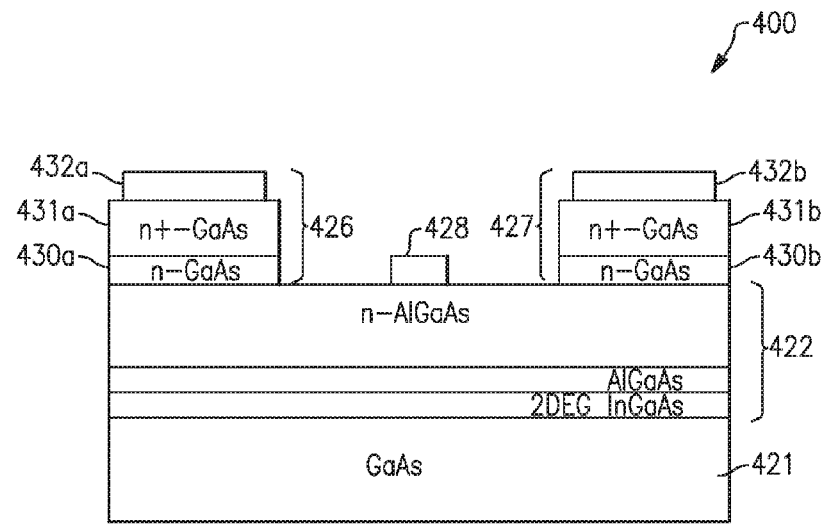
FIG. 10 is a cross-section of a HEMT according to one embodiment.

FIG. 10 is a cross-section of a HEMT 400 according to one embodiment. The HEMT 400 is implemented on a GaAs substrate 421, and includes a heterojunction structure 422, a source region 426, a drain region 427, and a gate region 428.

The heterojunction structure 422 includes an InGaAs layer 423 disposed over the GaAs substrate 421, an AlGaAs spacer layer 424 disposed over the InGaAs layer 423, and an n-type aluminum gallium arsenide (n-AlGaAs) layer 425 disposed over the spacer layer 424. The source region 426 is disposed over the heterojunction structure 422 and includes a first n-type GaAs region 430a, a first highly doped n-type GaAs region 431a disposed over the first n-type GaAs region 430a, and a first contact region 432a disposed over the first highly doped n-type GaAs region 431a. Additionally, the drain region 427 is disposed over the heterojunction structure 422, and includes a second n-type GaAs region 430b, a second highly doped n-type GaAs region 431b disposed over the second n-type GaAs region 430b, and a second contact region 432b disposed over the second highly doped n-type GaAs region 431b.

The gate region 436 is disposed over the heterojunction structure 422 between the source region 426 and the drain region 427. The gate region 436 is implemented using metal, and can be an E-mode gate or a D-mode gate depending on embodiment. For one example, the gate region 436 can be implemented using at least one of nickel (Ni), gold (Au), titanium (Ti), or platinum (Pt). The metal-semiconductor junction associated with the gate region 428 and the heterojunction structure 422 operates as a Schottky gate diode.

The HEMT 400 of FIG. 10 illustrates one example of a structure that can be used to implement the HEMTs described herein. However, HEMTs can be implemented in other ways. For example, although the HEMT 400 has been illustrated in the context of a GaAs process, the teachings herein are applicable to other compound semiconductor technologies, including, for example, GaN and InP technologies.

Additional details of the HEMT 400 can be as described earlier.

Figure 11:
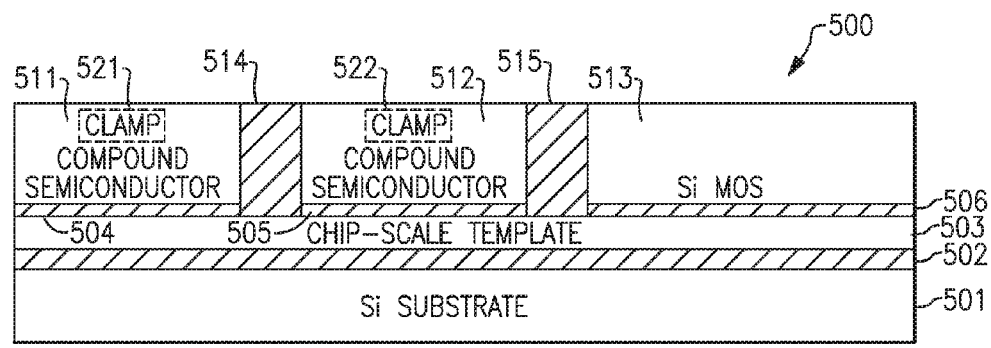
FIG. 11 is a cross-section of a heterogeneously integrated compound semiconductor circuit according to one embodiment.

FIG. 11 is a cross-section of a heterogeneously integrated compound semiconductor circuit 500 according to one embodiment. The heterogeneously integrated compound semiconductor circuit 500 includes a Silicon (Si) substrate 501, a first buffer structure 502, a chip-scale template 503, a second buffer structure 504, a third buffer structure 505, a fourth buffer structure 506, a first compound semiconductor circuit 511, a first isolation structure 514, a second compound semiconductor circuit 512, a second isolation structure 515, and a Si circuit 513.

The illustrated heterogeneously integrated compound semiconductor circuit 500 shows one example of integration of compound semiconductor circuitry on a foreign substrate. Although a Si substrate 501 is used in this example, other implementations of substrates possible, including, but not limited to Silicon carbide (SiC) substrates.

Although one specific embodiment is shown, a wide variety of configurations are possible, including, for example, implementations with a different arrangement of buffer structures, isolation structures, and/or a chip-scale template. Moreover, although FIG. 11 illustrates an embodiment including two compound semiconductor circuits and one Si circuit, more or fewer compound semiconductor circuits and/or Si circuits can be included. Furthermore, the heterogeneously integrated compound semiconductor circuit 500 can include other circuitry and/or structures.

The illustrated first compound semiconductor circuit 511 includes a first compound semiconductor protection clamp 521, and the second compound semiconductor circuit 512 includes a second compound semiconductor protection clamp 522. However, other configurations are possible, including configurations with more or fewer compound semiconductor protection clamps. The first and second compound semiconductor protection clamps 521, 522 can provide ESD/EOS protection the compound semiconductor circuit 511, 512 and/or other foreign substrate circuit 513, including, for instance, metal oxide semiconductor (MOS) transistors.

Thus, the illustrated embodiment implements multi-process technology functional blocks sharing a common Si substrate 501. Additionally, ESD/EOS protection is provided by the compound semiconductor protection clamps 521, 522. In certain implementations, the compound semiconductor protection clamps 521, 522 are connected via back-end metallization to protect neighboring circuit blocks of the common substrate 501.

Additional details of the heterogeneously integrated compound semiconductor circuit 500 can be as described earlier.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader.

Applications

Devices employing the above described protection schemes can be implemented into various electronic devices and interface applications. Examples of the electronic devices can include, but are not limited to, consumer electronic products or parts of consumer electronic products. For example, the compound semiconductor protection devices described herein can be included on a monolithic microwave integrated circuit (MMIC) including radio frequency and/or microwave circuits, such as power amplifiers, low noise amplifiers, voltage controlled oscillators, mixers, tuners, resonators, attenuators, and/or switches. The consumer electronic products can include, but are not limited to, a mobile phone, a telephone, a television, a computer monitor, a computer, a hand-held computer, a personal digital assistant (PDA), an automobile, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention.

Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A compound semiconductor circuit comprising:
   a first node;
   a second node;
   a compound semiconductor protection clamp electrically connected between the first node and the second node, wherein the compound semiconductor protection clamp comprises:
      a resistor-capacitor (RC) trigger network configured to detect a presence of a transient overstress event between the first node and the second node, wherein the RC trigger network is configured to generate an activation control signal in response to detecting the transient overstress event; and
      a metal-semiconductor field effect transistor (MESFET) clamp configured to receive the activation control signal from the RC trigger network and to selectively activate a discharge path between the first node and the second node based on the activation control signal; and
   a reverse protection circuit comprising a Schottky gate diode structure that activates in response to a negative polarity transient overstress event.

2. The compound semiconductor circuit of claim 1, wherein the MESFET clamp comprises an enhancement mode (E-mode) high electron mobility transistor (HEMT), wherein the E-mode HEMT comprises a gate configured to receive the activation control signal, a drain electrically connected to the second node, and a source electrically connected to the first node.

3. The compound semiconductor circuit of claim 1, wherein the MESFET clamp comprises a depletion-mode (D-mode) HEMT and one or more Schottky gate diodes electrically connected in series, wherein the D-mode HEMT comprises a gate configured to receive the activation control signal, a drain electrically connected to the second node, and a source electrically connected to the first node via the one or more Schottky gate diodes.

4. The compound semiconductor circuit of claim 1, wherein the MESFET clamp comprises a multi-gate HEMT including a first D-mode gate, a second D-mode gate, and an E-mode gate positioned between the first and second D-mode gates, wherein the E-mode gate is configured to receive the activation control signal from the RC trigger network.

5. The compound semiconductor circuit of claim 1, wherein the compound semiconductor protection clamp is implemented without any p-type implantation regions.

6. The compound semiconductor circuit of claim 1, wherein the RC trigger network generates the activation control signal in response to a positive polarity transient overstress event that increases a voltage of the second node relative to a voltage of the first node, and wherein the negative polarity transient overstress event decreases the voltage of the second node relative to the voltage of the first node.

7. The compound semiconductor circuit of claim 1, further comprising a mistrigger protection circuit configured to generate a mistrigger protection signal based on a voltage difference between the first node and the second node, wherein the MESFET clamp is further configured to selectively activate the discharge path between the first node and the second node based on the mistrigger protection signal.

8. The compound semiconductor circuit of claim 7, wherein the mistrigger protection circuit is configured to generate a low pass filtered voltage based on low pass filtering a voltage difference between the first node and the second node, wherein the mistrigger protection circuit generates the mistrigger protection signal based on the low pass filtered voltage.

9. The compound semiconductor circuit of claim 7, wherein the mistrigger protection circuit comprises a transistor that generates a mirrored current than changes in relation to a current flowing through the MESFET clamp, wherein the mistrigger protection circuit is configured to control a duration that the discharge path of the MESFET clamp is activated by providing feedback based on the mirrored current.

10. The compound semiconductor circuit of claim 1, further comprising a high frequency functional circuit that is protected by the compound semiconductor protection clamp, wherein the high frequency functional circuit comprises at least one of a power amplifier, a low noise amplifier, a voltage controlled oscillator, a mixer, a tuner, a resonator, an attenuator, or a switch.

11. A compound semiconductor protection clamp comprising:
   a resistor-capacitor (RC) trigger network configured to detect a presence of a transient overstress event between a first node and a second node, wherein the RC trigger network is configured to generate an activation control signal in response to detecting the transient overstress event; and
   a high electron mobility transistor (HEMT) clamp comprising:
      a heterojunction structure;
      a source region disposed over the heterojunction structure;
      a drain region disposed over the heterojunction structure; and
      a gate region disposed over the heterojunction structure and positioned between the source region and the drain region, wherein the gate region receives the activation control signal from the RC trigger network and selectively activates a discharge path between the first node and the second node based on the activation control signal; and
   one or more Schottky gate diodes electrically connected in series with the HEMT clamp between the first node and the second node.

12. The compound semiconductor protection clamp of claim 11, wherein the compound semiconductor protection clamp is fabricated on a gallium arsenide substrate.

13. The compound semiconductor protection clamp of claim 11, wherein the heterojunction structure comprises an indium gallium arsenide region and an aluminum gallium arsenide region.

14. The compound semiconductor protection clamp of claim 11, wherein the gate region comprises an E-mode gate region.

15. The compound semiconductor protection clamp of claim 14, further comprising a first D-mode gate region over the heterojunction structure and positioned between the source region and the E-mode gate region, and a second D-mode gate region over the heterojunction structure and positioned between the drain region and the E-mode gate region.

16. The compound semiconductor protection clamp of claim 11, wherein the gate region comprises a D-mode gate region.

17. The compound semiconductor protection clamp of claim 11, wherein the HEMT clamp is implemented without any p-type implantation regions.

18. The compound semiconductor protection clamp of claim 11, further comprising a mistrigger protection circuit configured to generate a mistrigger protection signal based on a voltage difference between the first node and the second node, and to provide the mistrigger protection signal to the gate region.

19. The compound semiconductor protection clamp of claim 18, wherein the mistrigger protection circuit is configured to generate a low pass filtered voltage based on low pass filtering a voltage difference between the first node and the second node, wherein the mistrigger protection circuit generates the mistrigger protection signal based on the low pass filtered voltage.

20. A method of protecting a compound semiconductor circuit, the method comprising:
   detecting a presence of a transient overstress event between a first node and a second node using a resistor-capacitor (RC) trigger network of a compound semiconductor protection clamp;
   generating an activation control signal in response to detecting the transient overstress event using the RC trigger network;
   receiving the activation control signal as an input to a metal-semiconductor field effect transistor (MESFET) clamp of the compound semiconductor protection clamp; and
   selectively activating a discharge path between the first node and the second node based on the activation control signal using the MESFET clamp; and
   discharging current through the MESFET clamp and through one or more Schottky gate diodes electrically connected in series with the MESFET clamp between the first node and the second node.

* * * * *